US008218329B2

(12) United States Patent
McIntyre

(10) Patent No.: US 8,218,329 B2
(45) Date of Patent: Jul. 10, 2012

(54) BACK-TO-BACK PACKAGE ACCOMPLISHING SHORT SIGNAL PATH LENGTHS

(75) Inventor: Harry J. McIntyre, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 200 days.

(21) Appl. No.: 12/748,799

(22) Filed: Mar. 29, 2010

(65) Prior Publication Data

US 2011/0235291 A1 Sep. 29, 2011

(51) Int. Cl.
*H05K 7/00* (2006.01)

(52) U.S. Cl. ........ 361/760; 361/782; 361/783; 361/803; 257/687; 257/723; 257/777; 174/255; 174/260; 174/261

(58) Field of Classification Search .......... 361/760–767, 361/732, 756, 772–779, 782–784, 811, 820, 361/821; 174/260–267; 257/668, 686, 678, 257/690–692, 679, 721–724, 777, 774, 738, 257/779, 782, E23.173; 438/106–118, 584; 439/68, 82, 567; 29/825–852, 890
See application file for complete search history.

(56) References Cited

U.S. PATENT DOCUMENTS

| | | | | |
|---|---|---|---|---|
| 4,774,632 | A * | 9/1988 | Neugebauer | 361/715 |
| 5,252,857 | A * | 10/1993 | Kane et al. | 257/686 |
| 5,982,633 | A * | 11/1999 | Jeansonne | 361/782 |
| 6,075,287 | A * | 6/2000 | Ingraham et al. | 257/706 |
| 6,104,088 | A * | 8/2000 | Hatano et al. | 257/698 |
| 6,200,830 | B1 * | 3/2001 | Ito et al. | 438/106 |
| 6,284,984 | B1 * | 9/2001 | Ohyama | 174/260 |
| 6,388,320 | B2 * | 5/2002 | Smola et al. | 257/724 |
| 6,424,034 | B1 * | 7/2002 | Ahn et al. | 257/723 |
| 6,437,990 | B1 * | 8/2002 | Degani et al. | 361/783 |
| 6,809,537 | B2 | 10/2004 | Adams | |
| 6,861,761 | B2 | 3/2005 | Yang et al. | |
| 6,862,192 | B2 * | 3/2005 | Yashiro | 361/803 |
| 6,943,454 | B1 * | 9/2005 | Gulachenski et al. | 257/777 |
| 6,992,940 | B1 * | 1/2006 | Tauber | 365/202 |
| 7,180,171 | B1 * | 2/2007 | Taheri | 257/700 |
| 7,250,675 | B2 * | 7/2007 | Fasano et al. | 257/723 |
| 7,339,794 | B1 * | 3/2008 | Wang et al. | 361/760 |
| 7,365,438 | B2 * | 4/2008 | Hedler et al. | 257/778 |
| 7,525,817 | B2 * | 4/2009 | Yashiro | 361/803 |
| 7,611,923 | B2 * | 11/2009 | Fasano et al. | 438/106 |

FOREIGN PATENT DOCUMENTS

| | | | |
|---|---|---|---|
| JP | 409186424 | A * | 7/1997 |
| JP | 2008159859 | A * | 7/2008 |

* cited by examiner

*Primary Examiner* — Michail V Datskovskiy
(74) *Attorney, Agent, or Firm* — Ronald E. Prass, Jr.

(57) ABSTRACT

This is a PCBA that can be used in any system where one component or package is connected to another component or package. This invention provides a very short connector or signal path that avoids the necessity of a signal trace termination in the PCB. The PCB has on its upper surface a first component or package and on its lower surface a second component or package in vertical physical and signal alignment with the first component or package. The first component or package has a BGA on its bottom surface and the second component has a BGA on its top surface, both of these BGAs are in electrical contact with each other. Because of the short signal trace provided, the PCB provides signal transitions as fast as 200 pS.

18 Claims, 4 Drawing Sheets

BACK-TO-BACK PACKAGE ACCOMPLISHING SHORT SIGNAL PATH LENGTHS

This invention relates circuit boards with a ball grid array, which is especially useful in high speed electrostatic marking systems.

BACKGROUND

While the present invention can be used in any circuit board where one component or package is connected to another component or package, it will be described for clarity in reference to xerographic or electrostatic marking systems. The use of ball grid array (BGA) is well known in the printed circuit board assembly (PCBA) art. The literature describes BGA structures as follows:

The BGA is descended from the pin grid array (PGA) which is a package with one face covered (or partly covered) with pins in a grid pattern. These pins are used to conduct electrical signals from the integrated circuit to the printed circuit board (PCB) it is placed on. In a BGA, the pins are replaced by balls of solder stuck to the bottom of the package. The device is placed on a PCB that carries copper pads in a pattern that matches the solder balls. The assembly is then heated, either in a re-flow oven or by an infrared heater, causing the solder balls to melt. Surface tension causes the molten solder to hold the package in alignment with the circuit board, at the correct separation distance, while the solder cools and solidifies. The BGA is a solution to the problem of producing a miniature package for an integrated circuit with many hundreds of pins. Pin grid arrays and small-outline integrated circuit (SOIC) packages were being produced with more and more pins, and with decreasing spacing between the pins, but this was causing difficulties for the soldering process. As package pins got closer together, the danger of accidentally bridging adjacent pins with solder grew. BGAs do not have this problem, because the solder is sometimes factory-applied to the package in exactly the right amount.

In high speed marking systems, speed of the system and space of structures used in the apparatus are very important considerations. Faster speed processors require that the connectors or signal traces be made shorter and at the same time, provide reliable signal traces lengths between packages. Sometimes in the prior art, the inductance in the longer signal traces blocks the signal; in high speed apparatus it is not acceptable to have blockage by an inductor. To minimize blockage, the present invention makes the length of the signal traces as short as possible and thereby minimizing the inductance.

A component on a printed circuit board is made up of a package which houses at least one silicone chip. Each package performs a specific function and each interacts with other packages by use of signal traces. For example, in a high speed copier coordinating the various processing stations exactly is not only desirable but is also necessary for proper functioning. A primary purpose of the present invention is to push the PCB architecture to a higher performance level by improving the time of package or component interaction with each other. The solder balls of the BGA are bonded on the bottom surface of the package and are the outer terminal of the package.

Coordinated ball grid array pairs are another way besides signal traces to provide connections between packages or components. The use of ball grid arrays in PCB are described in detail in U.S. Pat. Nos. 6,809,537B2 and 6,861,761 B2, the disclosures of these two patents are incorporated by reference into the present disclosure.

SUMMARY

High speed transitions on DDR signals and on expected future VCSEL ROS drive signals are approaching 200 pS, limiting trace lengths to well less than 1 inch to avoid reflections. DDR signal trace design already cannot be limited to 1 inch and require termination or drive strength calibration. The novel idea of this invention is the back-to-back arrangement of BGA packages with their solder balls and signal input/outputs (I/O's) such arranged for the shortest interconnect paths from one BGA package to the other. In today's Printed Circuit Board (PCB) process, this would mean all interconnects implemented with vias—optimally; or otherwise, interconnects, implemented with vias and signal traces, together short enough to avoid the necessity of signal trace termination. A purpose of the use of back-to-back ball grid array (BGA) packages, one on each side of a PCB includes use for high speed scanning or image path electronics. The solder balls would be coordinated for minimum signal paths from one package to the other across back-to-back solder balls connected by a via. Exemplar application would be VCSEL on one side and ASIC driver on the other. A difference in the present invention from the prior art is application to high speed electronics with connection through the board between back-to-back devices.

Rather than position the packages on a PCB first or upper face or side horizontally placed in relation to each other with long signal traces or connections, the present invention positions the packages in vertical alignment. In the present invention a first package is positioned on the upper side of the PCB, and a second package is positioned immediately below the first package on the lower side of the PCB. It is critical to the present invention that the first and second packages not only be in physical alignment but also the solder balls and I/Os of each package must be in signal alignment, as will be shown in the drawings. Signal alignment refers to each signal from the top BGA package, being directly across the printed circuit board (PCB) for its counterpart on the other BGA package on the lower side. In the case of a VCSEL and an ASIC Driver, the solder ball for each ASIC driver's output signal, DriveSig01 for example, would have to be directly across the PCB from the solder ball for the VCSEL that output drives, in this case, VCSEL01. By this vertical alignment of packages, termination resistors are not needed, and a huge space savings on the PCB is accomplished. Thus, the present invention provides a PCB with packages in vertical alignment on the upper and lower faces of the PCB, with the packages in both physical alignment and in signal alignment. The PCB of this invention is particularly suitable for use in a controller used in a high speed copier or marking systems.

DETAILED DISCUSSION OF DRAWINGS AND PREFERRED EMBODIMENTS

Figure 1:
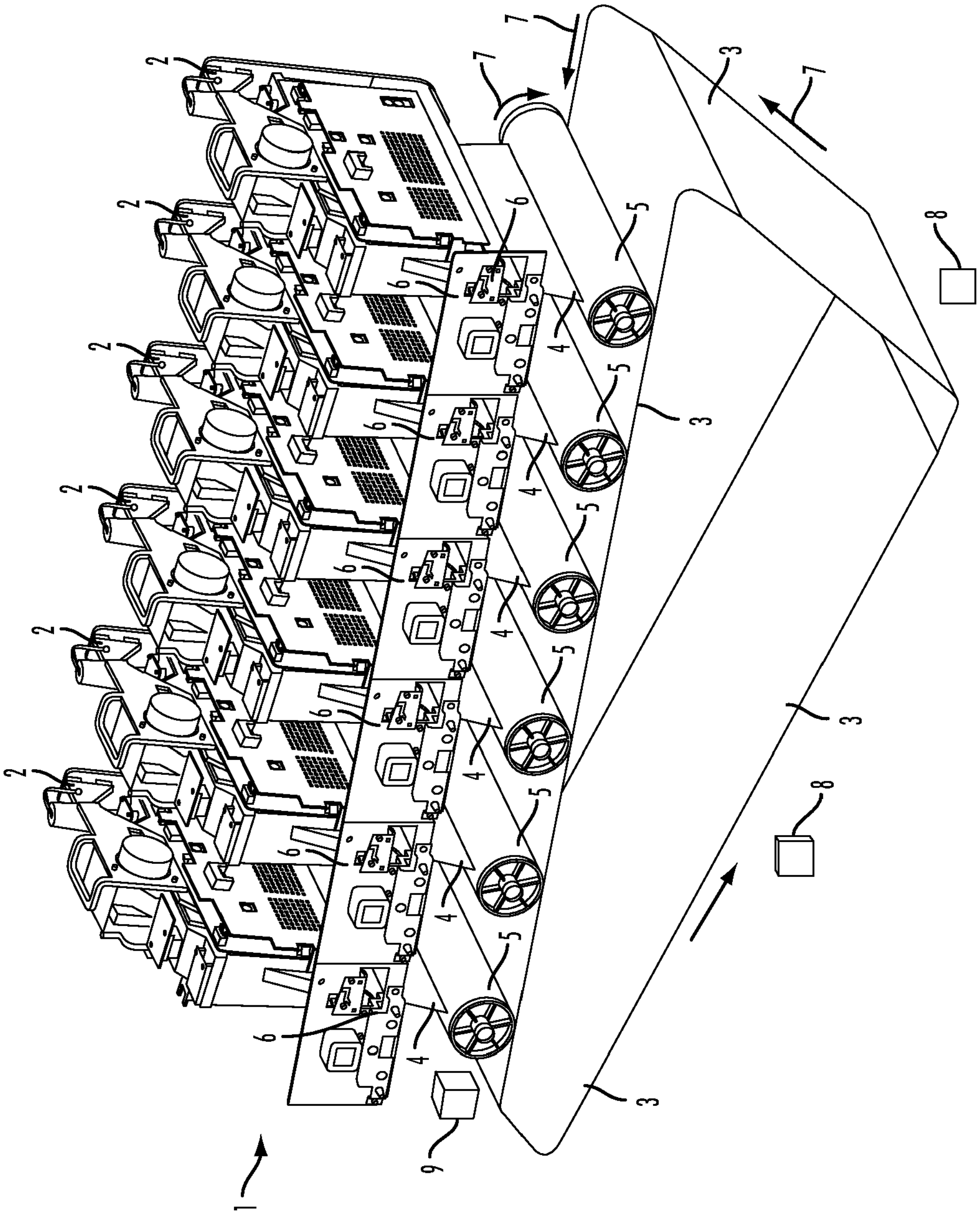
FIG. 1 illustrates a high speed color copier that can use the PCB of this invention with several xerographic and ROS units that must be exactly and timely coordinated.

In FIG. 1 a high speed color copier 1 is illustrated where sensor 8 and controller 9 containing the PCB of this invention is used to control the rapidly interacting marking units 10 of the copier. The units of each color station comprise a roster output scanner ROS 2 and a xerographic printing unit 10 with a drum 5. In this type of marking system each unit and structural components must be as rapidly coordinated and controlled as physically possible using an improved PCB where components and packages have faster and improved processing speeds. In marking system 1 a ROS emits a different image beam 4 onto drum 5 of a xerographic marking unit 10. The image is then transferred to an endless intermediate transfer belt 3. As the drum 5 rotates, the charged regions pick up toner of the color for that particular imaging station. At the end of the process, all six deposited images must be rapidly and precisely aligned to form the color image which is formed on the belt 3 and which is eventually transferred to a substrate or media. The high speed electrostatic apparatus shown has the "conventional" xerographic stations; i.e. charging station, exposure station, developer station, fusing station, transfer station, and cleaning station. These stations will be referred to in the claims as the "conventional processing stations or conventional xerographic processing stations." The arrows 7 indicate the rotation of the belt and 8 is a sensor in connection with a controller 9. The controller 9 coordinates all of the activity of marking system 1 and controller 9 contains the PCB 11 of this invention. Each color unit 6 contains a different color dispenser.

Figure 2:
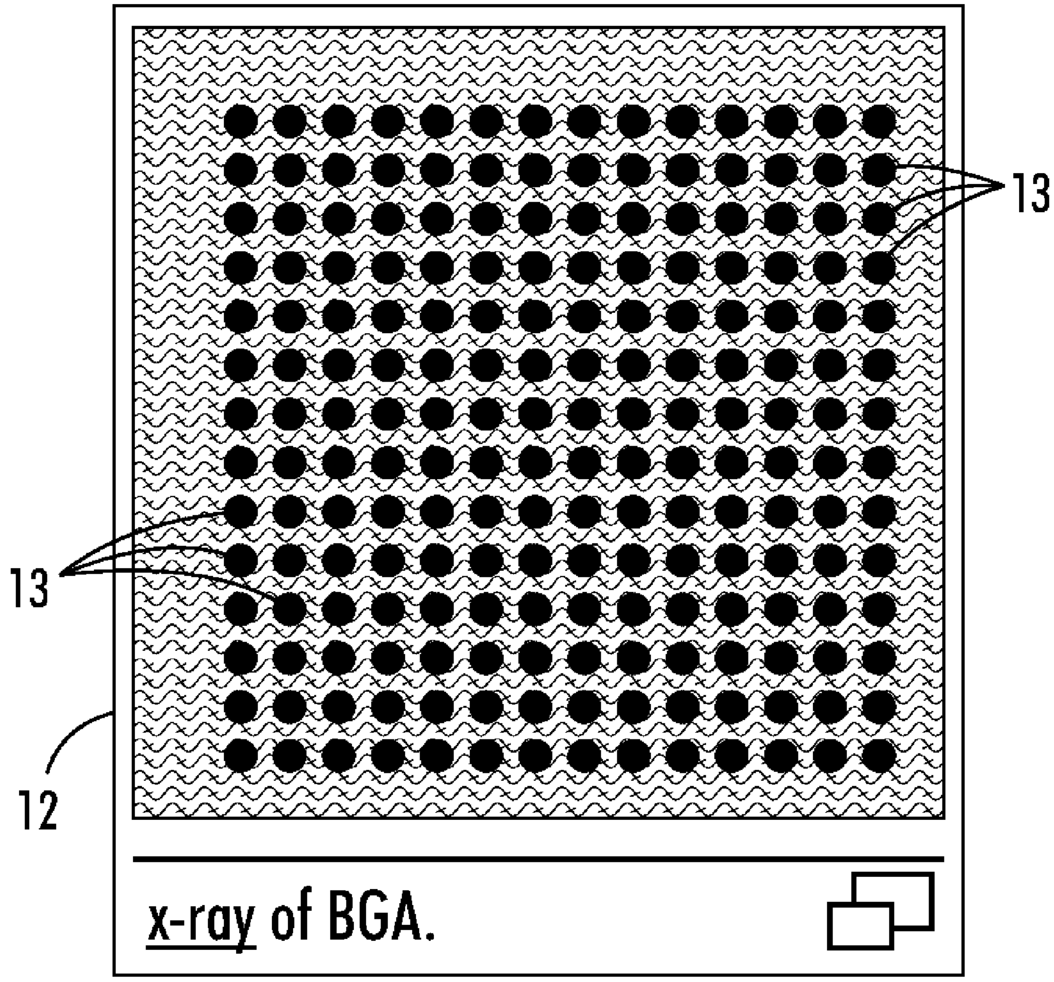
FIG. 2 is an illustration of a ball grid array at the package bottom surface or in the present case at a bottom and top surface of a package.

In FIG. 2 a package lower surface 12 is shown with an array of solder balls 13 of the BGA which act as the connectors with packages or components of the present invention. This exact ball array is positioned on an upper surface of a package in the present invention. The solder balls 13 on the upper surface are in alignment with the solder balls 13 on the lower surface of the above package.

Figure 3:
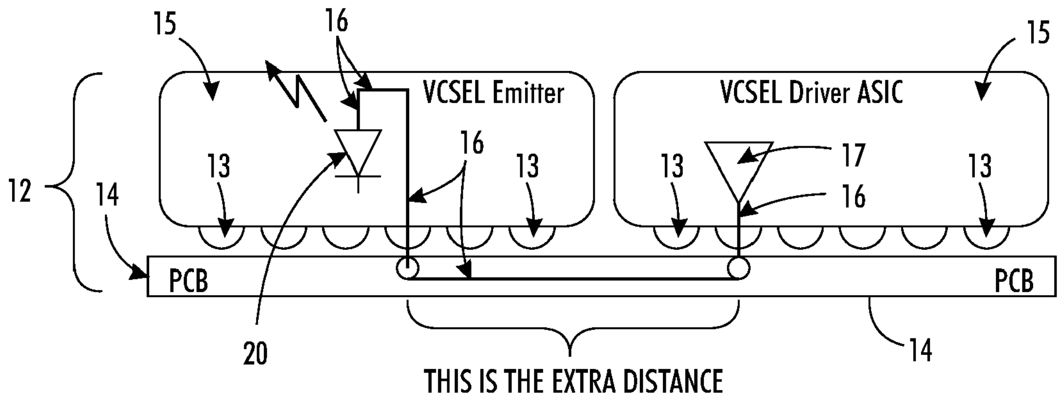
FIG. 3 PRIOR ART
FIG. 3 illustrates the connection of packages in the prior art.
Figure 4:
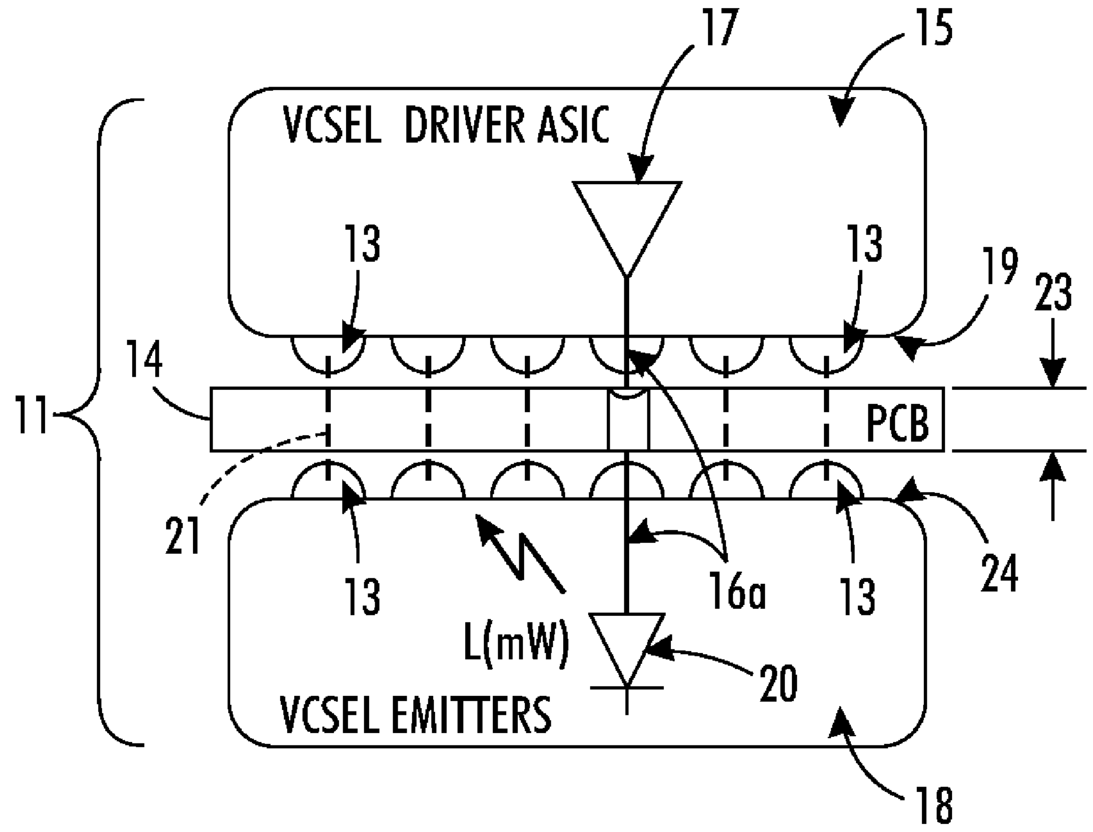
FIG. 4 is an illustration of an embodiment of the present invention where the packages are in vertical alignment with ball grid arrays on the bottom surface of a top package and a top surface of a bottom package.

In FIG. 3, a portion of the PCB of prior art PCB is shown. The length of signal trace 16 is shown as it connects prior art components or packages 15. The relatively long length of prior art signal trace 16 is not desirable for faster speed processing. Often the electrical properties in the longer signal trace 16 has inductance in the connection which blocks the signal. This invention as shown in FIG. 4 makes the signal trace 16 as short as possible to minimize signal blockage by minimizing the inductance. It is very desirable that the length of the signal path or signal trace 16 is reduced by trace 16*a* to the thickness of the PCB 14 as shown in FIG. 4 in the present invention.

In an embodiment of the present invention shown in FIG. 4 an upper package 18 has solder balls 13 of a BGA positioned on its bottom surface 19. The upper package 18 must be in physical vertical alignment with lower package 20, but it is also necessary that upper package 18 and lower package 20 be in signal alignment as shown by dotted lines 21. The Driver ASIC in upper package 18 provides a driving signal, 21, to a VCSEL Laser, in lower package 20. The VCSEL in lower package 20, when receiving the Driver ASIC's signal, turns on to emit light. The very short connection or signal trace 21 of this invention significantly improves on the use of the much longer signal traces 16 of the prior art because the inductance in the connection is reduce proportionally with the reduction of the connection's or signal trace's length, and hence, signal blockage is reduced equally. High speed transitions on Dual Data Rate Memory Module (DDR) interface (signals and on expected future VCSEL Raster Output Scanner (VCSEL ROS) drive signals are approaching 200 picoSeconds (pico=1/1000000000000), limiting trace lengths to well less than 1 inch to avoid reflections. DDR signal trace design already cannot be limited to 1 inch and require termination. Back-to-back BGA packages with solder balls coordinated for signal paths alignment 21 from one package to the other across back-to-back solder balls 13 can provide short enough signal traces to avoid the necessity of signal trace termination. It is important that the upper package 18 have solder balls 13 of a ball grid array on its bottom surface 19 while the lower package 20 have solder balls 13 of a ball grid array BGA on its top surface 24. The BGA's of the upper package 18 and the BGA's of the lower package 20, as noted earlier, must be in physical and signal alignment.

The illustrations of FIG. 3 and FIG. 4 contrasts the difference between signal trace lengths 16 currently achievable and signal trace lengths 16*a* achievable using this new novel concept of this invention. The part of the signal trace, 16, denoted, "This segment is Extra Distance", is typically 2 inches or more when implemented in the prior art of FIG. 3. The signal trace does not need this extra segment and can easily achieve signal path lengths of less than one quarter inch. Referring to FIG. 4, the length is optimized if the pinouts of the two BGA packages, 15 and 18 are coordinated for each signal trace to have, the solder ball 13, of package 15, directly on the opposite side of the PCB from the solder ball 13, of package 18, for that signal trace. Such small signal trace lengths 16*a* can accommodate signal transitions as fast as 200 pS without termination resistors or other termination techniques. This technique is useful for microprocessor to DDR signals and any other fast transitioning signals going from one chip to another and is not limited to BGA packages.

The connection between BGA of upper package 15 and lower aligned package 18 provides both physical package vertical alignment and signal alignment which are both necessary to the optimum implementation of this present invention. The length of signal trace or connection 16*a* is only limited by the thickness 23 of PCB of the present invention. Faster speed processors have required making the signal trace 16*a* shorter than trace 16 as shown in FIGS. 3 and 4, respectively. The BGA of this invention is used to provide shorter connections from one component to another.

In summary, the present invention provides a novel high speed machine system and a novel printed circuit board assembly. This high speed electrostatic marking system comprises conventional xerographic stations, at least one sensor and at least one system controller. The system controller comprises a printed circuit board assembly PCBA that comprises a PCB substrate having an upper surface and a lower surface. At least a first component or package is positioned on the upper surface, and at least a second component or package is positioned on the lower surface of the PCB. The first component or package has a ball grid array (BGA) positioned on its bottom surface, and the second component or package has a ball grid array (BGA) positioned on its top surface. A connector or signal trace electronically connects the first and second components. In both the marking system and the PCBA of this invention the connector has a minimal signal path length defined by a thickness of the PCB substrate plus the thickness of the BGA arrays on the first and second components. The BGA arrays on the first and second components are substantially physically vertically aligned with each other, and the BGA arrays on the first and second components are in signal alignment with each other. The connector, because of its relatively short length, is configured to avoid the necessity of the use of a signal trace termination. In one embodiment of the marking system and the PCBA, the connector or signal path has a length of less than one quarter inch. The connector or signal path is configured to avoid the necessity of connector terminal resistors or other termination techniques in said PCBA, thereby permitting substantially small size PCBs to result thereby. In the PCBA the signal transitions are as fast as 200 pS. The PCBA is configured to accommodate high speed scanning electronics.

The printed circuit board of this invention comprises a PCB substrate having an upper surface and a lower surface. At least a first component or package is positioned on the upper surface, and at least a second component or package positioned on the lower surface of the PCB. The first component or package has a ball grid array BGA positioned on its bottom surface, and the second component or package has a ball grid array BGA positioned on its top surface. A connector or signal trace electrically connects the first and second components.

It will be appreciated that variations of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A high speed electrostatic marking system comprising:

conventional xerographic stations, at least one sensor and at least one system controller, said system controller comprising a printed circuit board PCBA, said circuit board comprising a PCB substrate having an upper surface and a lower surface, at least a first component or package positioned on said upper surface, and at least a second component or package positioned on said lower surface, said first component or package having a ball grid array (BGA) positioned on its bottom surface, and said second component or package having a ball grid array (BGA) positioned on its top surface, a connector or signal trace electrically connecting said first and second components, wherein the first component is a VCSEL Driver ASIC and the second component is a VCSEL laser emitter, the VCSEL laser emitter receiving a driving signal from the VCSEL driver ASIC and emits light.

2. The marking system of claim 1 wherein said connector has a minimal signal path length defined by a thickness of said PCB substrate plus the thickness of said BGA arrays on said first and second components.

3. The marking system of claim 1 wherein said BGA arrays on said first and second components are substantially physically vertically aligned with each other.

4. The marking system of claim 1 wherein said BGA arrays on said first and second components are in signal alignment with each other.

5. The marking system of claim 1 wherein said connector, because of its relatively short length, is configured to avoid the necessity of signal trace termination.

6. The marking system of claim 1 wherein said connector or signal path has a length of less than one quarter inch.

7. The marking system of claim 1 wherein said connector or signal path is configured to avoid the necessity of connector terminal resistors or other termination techniques in said PCB, thereby permitting substantially small PCBs to result thereby.

8. The marking system of claim 1 wherein signal transitions as fast as 200 pS are provided.

9. The marking system of claim 1 wherein said PCB is configured to accommodate high speed scanning electronics.

10. A printed circuit board assembly comprising a PCB substrate having an upper surface and a lower surface, at least a first component or package positioned on said upper surface, and at least a second component or package positioned on said lower surface, said first component or package having a ball grid array BGA positioned on its bottom surface, and said second component or package having a ball grid array BGA positioned on its top surface, a connector or signal trace, electrically connecting said first and second components, wherein the first component is a VCSEL Driver ASIC and the second component is a VCSEL laser emitter, the VCSEL laser emitter receiving a driving signal from the VCSEL driver ASIC and emits light.

11. The printed circuit board of claim 10 wherein said connector has a minimal signal path length defined by a thickness of said PCB substrate, plus the thickness of said BGA arrays on said first and second components.

12. The printed circuit board of claim 10 wherein said BGA arrays on said first and second components are substantially physically vertically aligned with each other.

13. The printed circuit board of claim 10 wherein said BGA arrays on said first and second components are in signal alignment with each other.

14. The printed circuit board of claim 10 wherein said connector, because of its relatively short length, is configured to avoid the necessity of signal trace termination.

15. The printed circuit board of claim 10 wherein said connector or signal path has a length of less than one quarter inch.

16. The printed circuit board of claim 10 wherein said connector or signal path is configured to avoid the necessity of connector terminal resistors or other termination techniques in said PCB, thereby permitting substantially small PCBs to result thereby.

17. The printed circuit board of claim 10 wherein signal transitions as fast as 200 pS are provided.

18. The printed circuit board of claim 10 wherein said PCB is configured to accommodate high speed scanning electronics.

* * * * *